(12) United States Patent
Fackelmeier et al.

(10) Patent No.: US 9,620,835 B2
(45) Date of Patent: Apr. 11, 2017

(54) DECOUPLING OF SPLIT RING RESONATORS IN MAGNETIC RESONANCE TOMOGRAPHY

(71) Applicants: Andreas Fackelmeier, Thalmässing (DE); Sebastian Martius, Forchheim (DE)

(72) Inventors: Andreas Fackelmeier, Thalmässing (DE); Sebastian Martius, Forchheim (DE)

(73) Assignee: Siemens Aktiengesellschaft, München (DE)

(*) Notice: Subject to any disclaimer, the term of this patent is extended or adjusted under 35 U.S.C. 154(b) by 721 days.

(21) Appl. No.: 14/040,611

(22) Filed: Sep. 27, 2013

(65) Prior Publication Data

US 2014/0091801 A1   Apr. 3, 2014

(30) Foreign Application Priority Data

Sep. 28, 2012   (DE) .................. 10 2012 217 760

(51) Int. Cl.
| | |
|---|---|
| *G01R 33/34* | (2006.01) |
| *H01P 1/203* | (2006.01) |
| *G01R 33/3415* | (2006.01) |
| *G01R 33/36* | (2006.01) |
| *H01P 5/02* | (2006.01) |

(52) U.S. Cl.
CPC .......... *H01P 1/20381* (2013.01); *G01R 33/34* (2013.01); *G01R 33/3415* (2013.01); *G01R 33/365* (2013.01); *H01P 5/028* (2013.01)

(58) Field of Classification Search
CPC .. G01R 33/365; G01R 33/34; G01R 33/3415; H01P 1/20381; H01P 5/028
See application file for complete search history.

(56) References Cited

U.S. PATENT DOCUMENTS

| | | | | |
|---|---|---|---|---|
| 5,594,342 | A | * 1/1997 | Brey ...................... | G01R 33/34 324/318 |
| 5,905,378 | A | * 5/1999 | Giaquinto ........ | G01R 33/34084 324/318 |
| 7,924,009 | B2 | * 4/2011 | Bosshard ............. | G01R 33/365 324/318 |
| 8,035,382 | B2 | 10/2011 | DeVries et al. | |
| 2001/0038325 | A1 | * 11/2001 | Smith .................... | H01Q 1/364 333/202 |
| 2004/0124840 | A1 | * 7/2004 | Reykowski .......... | G01R 33/365 324/318 |

(Continued)

*Primary Examiner* — Clayton E Laballe
*Assistant Examiner* — Ruifeng Pu
(74) *Attorney, Agent, or Firm* — Lempia Summerfield Katz LLC

(57) ABSTRACT

An arrangement includes a plurality of split ring resonators on a planar substrate. Each split ring resonator of the plurality of split ring resonators includes two mutually parallel ring structures of a metal conductor element spaced apart by the substrate. The two mutually parallel rings structures are respectively separated by at least one gap. At least two split ring resonators of the plurality of split ring resonators are positionable relative to one another such that the separated ring structures may be reciprocally guided through a gap of the respective other ring structures and interlock. Overlap regions may be produced by common ring structure inner surfaces.

20 Claims, 2 Drawing Sheets

(56) References Cited

U.S. PATENT DOCUMENTS

| | | | |
|---|---|---|---|
| 2007/0257670 A1* | 11/2007 | Giaquinto | G01R 33/34007 324/300 |
| 2007/0279062 A1* | 12/2007 | Greim | G01R 33/3415 324/322 |
| 2008/0224656 A1* | 9/2008 | Schulz | H02J 7/0052 320/108 |
| 2009/0054759 A1* | 2/2009 | Chmielewski | G01R 33/34046 600/422 |
| 2010/0079354 A1* | 4/2010 | Lam | H01Q 15/02 343/909 |
| 2010/0127707 A1* | 5/2010 | Lee | G01R 33/34007 324/318 |
| 2010/0156573 A1* | 6/2010 | Smith | H01P 3/081 333/239 |
| 2010/0181998 A1* | 7/2010 | Schulz | A61B 5/05 324/239 |
| 2010/0277398 A1* | 11/2010 | Lam | H01Q 15/02 343/909 |
| 2011/0181303 A1* | 7/2011 | Xiao | B82Y 25/00 324/656 |
| 2012/0086463 A1* | 4/2012 | Boybay | B82Y 15/00 324/612 |
| 2012/0236895 A1* | 9/2012 | Miles | H01P 7/08 372/55 |
| 2014/0111290 A1* | 4/2014 | Stevens | H04B 5/0012 333/236 |
| 2014/0232482 A1* | 8/2014 | Wada | H01P 1/20381 333/134 |
| 2015/0048823 A1* | 2/2015 | Fackelmeier | G01R 33/341 324/309 |
| 2015/0192721 A1* | 7/2015 | El-Kady | G02B 1/002 359/352 |
| 2015/0200732 A1* | 7/2015 | Hong | H05H 15/00 455/41.2 |
| 2016/0033592 A1* | 2/2016 | Demir | G01R 33/286 324/322 |
| 2016/0079811 A1* | 3/2016 | Seo | H01P 7/08 307/104 |

* cited by examiner

DECOUPLING OF SPLIT RING RESONATORS IN MAGNETIC RESONANCE TOMOGRAPHY

This application claims the benefit of DE 10 2012 217 760.4, filed on Sep. 28, 2012, which is hereby incorporated by reference.

BACKGROUND

The present embodiments relate to an arrangement of a plurality of split ring resonators on a planar substrate.

Magnetic resonance tomography (MRT) has already been in use in radiology for a length of time. Magnetic resonance tomography is based on very strong magnetic fields and alternating magnetic fields in the radio frequency range that are used to excite specific atomic nuclei (e.g., mostly hydrogen nuclei/protons) in the body to move by resonance. The movement induces an electric signal in a receiver circuit. Specific MRT methods have been developed to be able to display information relating to the microstructure and function of the organs in addition to displaying position and shape.

In order to provide a high quality of the images made with the aid of magnetic resonance tomography, antenna arrays that have a low signal-to-noise ratio are being developed. Increasing the magnetic field strength, however, is automatically accompanied by an increase in the design space for the magnetic resonance tomographs with control, in addition, that is also more complex. A further possibility, specifically the lengthening of the read and/or scan time, may not be justified since the service life and/or efficiency of a magnetic resonance tomograph is greatly restricted. A further approach is to employ small receive antennas, since the small receive antennas have a smaller "field of view." Reducing the antenna and/or coil field of view also reduces the negative effects (e.g., noise). However, this solution may not be employed in the case of relatively large objects and/or fields of view.

A plurality of antennas or antenna arrays has been employed in order also to be able to scan relatively large fields of view and/or objects. However, increasing the number of antennas gives rise, owing to the inductive coupling and thus influence from the individual antennas, to harmful side effects that restrict an increase in performance regarding the quality of information and/or images.

The attempts to date to decouple the individual antennas have been very complicated and expensive.

Owing to the high achievable level of image quality in magnetic resonance tomography, antenna arrays employed the use of a plurality of split ring resonators (SRRs). Such resonators or resonant circuits include two opposite metal conductor elements that may be applied parallel to one another on opposite sides of a substrate and act as capacitive elements, while the two opposite metal conductor elements simultaneously also act as inductive elements. The conductor elements themselves are formed as separated ring structures. The SRRs are supplied with energy by high frequency (HF) wave radiation, thus being excited to resonant vibrations.

Decoupling the SRRs has been complicated and costly. Thus, in magnetic resonance tomography, conventional loops with DC isolation may be used. A single-layer substrate is sufficient (see U.S. Pat. No. 8,035,382 B2). Because of the double-sided conductor track guidance, a multilayer substrate is used when decoupling the SRRs by geometric overlapping. HF substrates are, however, complicated to produce, and therefore very expensive. In the case of a multilayer substrate (e.g., printed circuit board), the SRRs on the individual layers are to have different dimensions since different resonant frequencies are produced given an identical embodiment in the different layers. Given octagonal loops, a further printed circuit board of, for example, at least four layers is used. In order to reduce the number of layers, the octagonal loops may be reduced by a longitudinal capacitance or smaller capacitive individual loops. Disregarding the production costs, this solution further uses complicated matching.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an arrangement of a plurality of split ring resonators that enables more efficient decoupling and is easier to produce and therefore cost effective is provided.

Such an arrangement has a plurality of split ring resonators on a planar substrate. Each of the split ring resonators includes two mutually parallel ring structures, spaced apart by the substrate, of a metal conductor element. At least two split ring resonators may be positioned relative to one another such that the separated ring structures may be reciprocally guided through a gap of the respective other ring structures and interlock. Overlap regions may be produced by common ring structure inner surfaces. An advantage of the arrangement is provided in the decoupling of the individual split ring resonators (SRRs). There is no need for multilayer substrate material, which is cost effective as regards production.

In one embodiment, the interlocking ring structures of the metal conductor elements have no common contact points. Owing to the advantageous arrangement of the individual metal conductor elements, an insulation layer between different conductor elements may be dispensed with. Again, there is no need for multilayer substrate material.

In a further embodiment, the interlocking ring structures have a polygonal shape. The polygonal shape greatly simplifies optimization of the decoupling, since the individual gaps of the metal conductor elements need no longer be displaced.

In a further embodiment, at least two split ring resonators may be matched/decoupled as a function of a configuration of the polygonal shape of the interlocking ring structures and/or overlap regions. Matching and/or decoupling without any change in the region of the gaps may be provided with a polygonal shape (e.g., a hexagonal structure). Decoupling may easily be set by varying the polygonal shape of the interlocking metal conductor elements of the ring structures and/or surface of the overlap regions.

In an embodiment, predetermined ring structures and/or a plurality of metal conductors may be bridged. The resonant frequency of the split ring resonators may be set by a varyingly high number of bridges.

In a further embodiment, the resonant frequency of the SRRs may be set by different sizes of the split ring resonators and/or the conductor widths. This provides a further setscrew for decoupling and/or matching individual SRRs.

A further aspect relates to a magnetic resonance tomography device with an arrangement of a plurality of split ring resonators. A magnetic resonance tomography device provided with an arrangement of a plurality of split ring resonators permits high quality images to be taken and provided, since the signal-to-noise ratio of the device is low owing to the decoupling of the plurality of split ring resonators.

DETAILED DESCRIPTION

Figure 1:
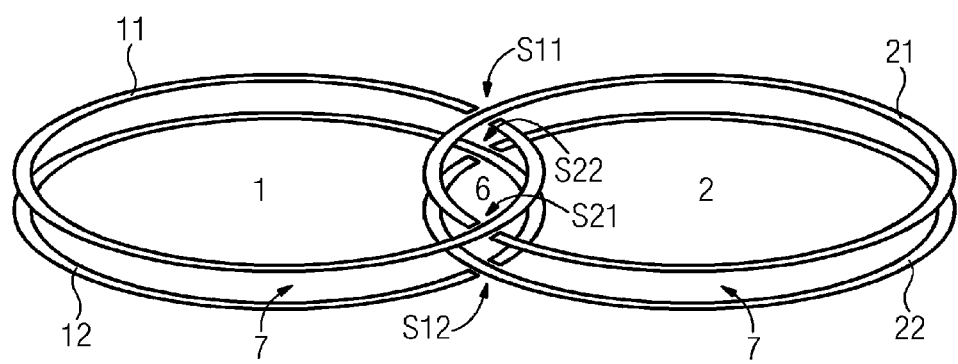
FIG. 1 shows a perspective view of one embodiment of an arrangement of two split ring resonators.
Figure 2:
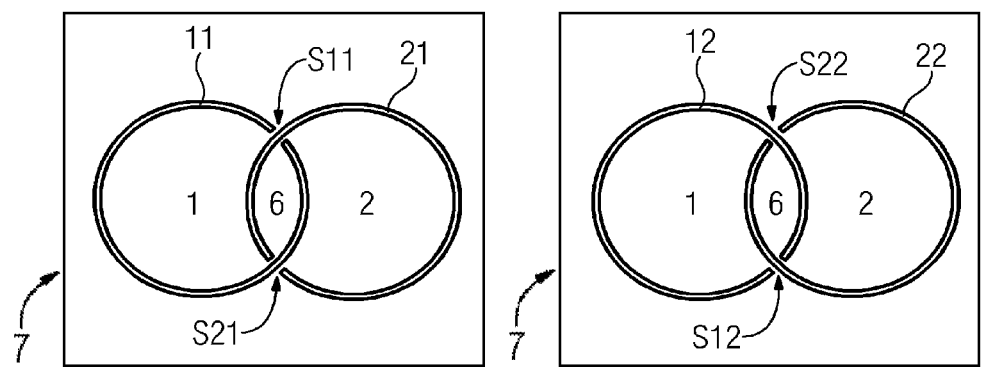
FIG. 2 shows an upper and lower view of one embodiment of the arrangement of split ring resonators according to FIG. 1.

A perspective view of an embodiment of an arrangement with two split ring resonators 1, 2 is illustrated in FIG. 1 in a simplified fashion. A split ring resonator 1, 2 respectively includes two mutually parallel ring structures 11, 12; 21, 22 of a metal conductor element spaced apart by a substrate 7. The two mutually parallel ring structures 11, 12; 21, 22 are respectively separated by at least one gap S11, S21, S . . . ; S12, S22, S . . . . The two split ring resonators 1, 2 are arranged relative to one another such that the separated ring structures 11, 12 of the two split ring resonators 1, 2 may be reciprocally guided through a gap S11, S12 of the respective other ring structure 21, 22 with the associated gap S21, S22, and interlock. Overlap regions 6 are formed as interface of the respective ring structures 11, 21 and 12, 22. In anticipation of FIG. 2, which illustrates an upper and lower projection view into a substrate plane 7 in accordance with the embodiment from FIG. 1, the arrangement of the two split ring resonators 1, 2 with associated ring structures 11, 12 and 21, 22 is shown. FIG. 2 shows that the interlocking ring structures 11, 21 and 12, 22 have no common contact points. A DC isolation of the split ring resonators 1, 2 is achieved by the overlapping of the ring structures 11, 21 and 12, 22. The DC isolation of the two split ring resonators 1, 2 improves the quality of the arrangement and minimizes the signal-to-noise ratio. Further embodiments for optimizing the reciprocal decoupling of a plurality of split ring resonators 1, 2, 3, 4 are provided by varying the sizes and/or conductor widths of the ring structures 11, 21, 31, 41; 12, 22, 32, 42 and by varying the size of the overlap region 6 and also the clearances of the gaps S11, S21, S . . . ; S12, S22, S . . . . A further option for setting the decoupling of the split ring resonators 1, 2 is the thickness and selection of the material of the substrate 7.

The exemplary embodiment described above has been selected as representative of the action and function of the arrangement of split ring resonators 1, 2 and the DC isolation for all subsequent further exemplary embodiments. For the sake of clarity, the reference symbols have therefore not been completed in the exemplary embodiments from FIG. 3 and FIG. 4, since the figures speak for themselves when viewed in relation to the exemplary embodiment from FIGS. 1 and 2.

Figure 3:
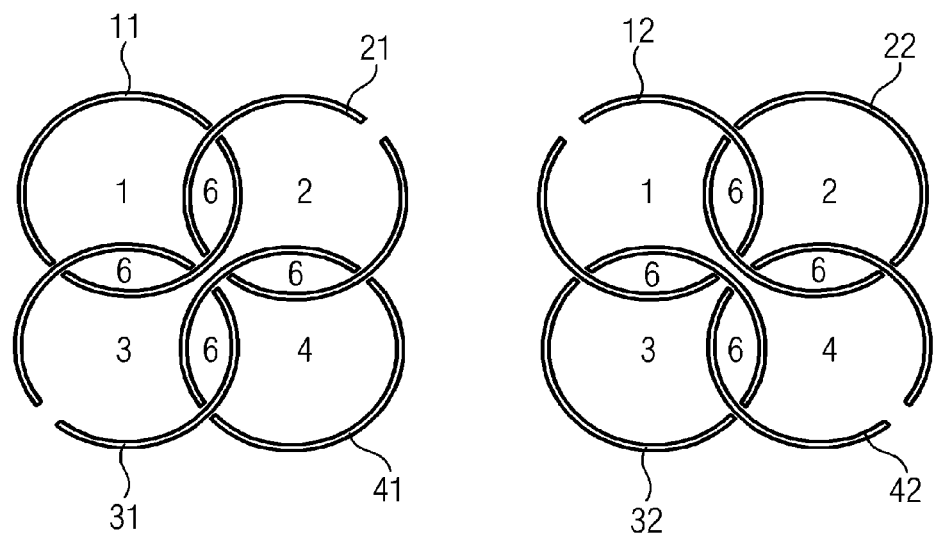
FIG. 3 shows an upper and lower view of one embodiment of an arrangement of four split ring resonators.

In the exemplary embodiment of FIG. 3, an arrangement of four split ring resonators 1, 2, 3, 4 is illustrated as an upper and a lower projection of the split ring resonators 1, 2, 3, 4 in the plane of the substrate 7. A plurality of overlap regions 6 are produced in this case. When four or more split ring resonators 1, 2, 3, 4, for example, are decoupled, each split ring resonator 1, 2, 3, 4 has two gaps in a ring structure 11, 21, 31, 41 and 12, 22, 32, 42, respectively, the resonant frequency thereby being increased. Dividing the ring structures 11, 21, 31, 41 and 12, 22, 32, 42 increases the number of the capacitances thereby produced, which add together to form a smaller total capacitance and thus lead to an increase in the resonant frequency. A disadvantage of the arrangement in accordance with the embodiment of FIG. 3 is a difficult optimization with regard to the decoupling, since when displacing individual split ring resonators 1, 2, 3, 4, the individual associated gaps S11, S12, S22, S21 . . . are also to be displaced. The two split ring resonators 1 and 4 or 2 and 3 are not decoupled. These may be decoupled by compensation circuits according to an embodiment.

Figure 4:
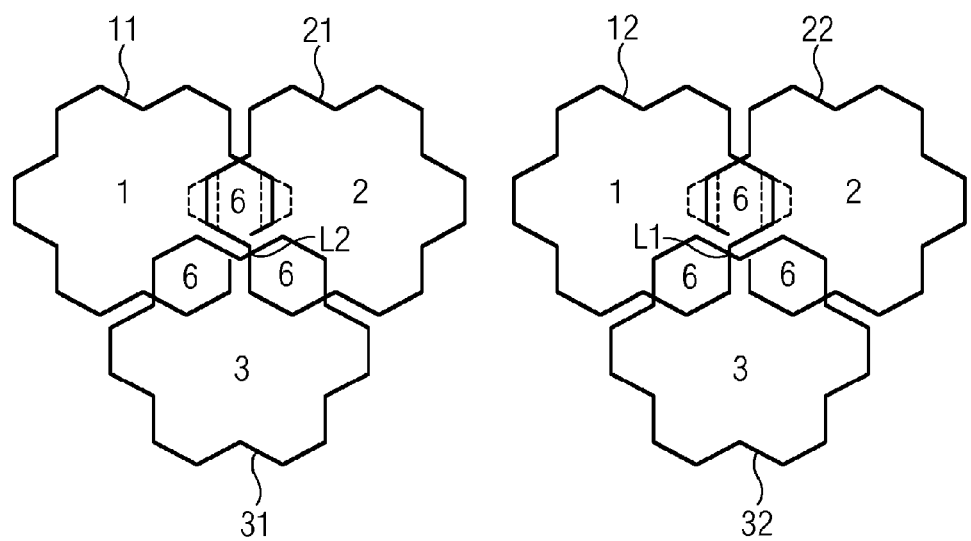
FIG. 4 shows an upper and lower view of one embodiment of an arrangement of three split ring resonators.

The further exemplary embodiment in accordance with FIG. 4 shows split ring resonators 1, 2, 3 with ring structures 11, 21, 31; 12, 22, 32 that have a polygonal shape (e.g., a "snowflake" shape). The overlap regions 6 produced in this case have the shape of a regular hexagon.

The embodiment shown in FIG. 4 is intended here to serve merely as an illustration of a further possible shape of the ring structure 11, 21, 31 or 12, 22, 32, and, as in the preceding exemplary embodiments, does not have corresponding gaps S11, S12, . . . ; S21, S22, . . . . The hexagonal structure permits matching or decoupling of the respective split ring resonators 1, 2, 3 without having, in this case, to undertake changes in the region of the gaps. By varying the metal conductor elements of the ring structures 11, 21, 31 or 12, 22, 32 in the respective overlap region 6 (indicated by the dashed lines in FIG. 4), the individual neighboring split ring resonators 1, 2, 3 may be decoupled. The resonant frequency may be set together with the conductor width and/or size of the split ring resonator 1, 2, 3 by providing a specific number of bridges L1, L2, . . . .

In addition to the decoupling of the split ring resonators that is illustrated in the above exemplary embodiments, all conventional known decoupling devices may be used. The exemplary embodiments illustrated here may attain a higher quality of the split ring resonators 1, 2, 3, 4 and/or may minimize the signal-to-noise ratio. By suitable selection of the substrate 7, the number and size as well as the shape of the split ring resonators 1, 2, 3, . . . , the arrangement permits the provision of a suitable antenna array that may no longer be matched, or may be matched much more easily (e.g., a total impedance). The number of the split ring resonators 1, 2, 3, 4 arranged relative to one another was selected only by way of example, and a plurality of further split ring resonators 1, 2, 3, . . . , n may be provided.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An arrangement comprising:
a plurality of split ring resonators on a planar substrate,
wherein each split ring resonator of the plurality of split ring resonators comprises two mutually parallel ring structures of a metal conductor spaced apart by the planar substrate,
wherein each ring structure of the two mutually parallel ring structures comprises a gap,
wherein at least two split ring resonators of the plurality of split ring resonators are positioned relative to one another such that ring structures of a first split ring resonator and a second split ring resonator of the plurality of split ring resonators are reciprocally positioned through gaps of ring structures and interlock, and
wherein overlap regions are produced by inner surfaces of the ring structures of the first split ring resonator and the second split ring resonator, the overlap regions configured to decouple the at least two interlocked split ring resonators.

2. The arrangement as claimed in claim 1, wherein the interlocking ring structures of the metal conductor have no common contact points.

3. The arrangement as claimed in claim 1, wherein the interlocking ring structures have a polygonal shape.

4. The arrangement as claimed in claim 3, wherein at least two split ring resonators of the plurality of split ring resonators are matchable/decoupleable as a function of a configuration of the polygonal shape of the interlocking ring structures.

5. The arrangement as claimed in claim 1, wherein predetermined ring structures, a plurality of metal conductors, or the predetermined ring structures and the plurality of metal conductors are bridgeable.

6. The arrangement as claimed in claim 1, wherein the plurality of split ring resonators have different sizes, conductor widths, or sizes and conductor widths.

7. The arrangement as claimed in claim 2, wherein the interlocking ring structures have a polygonal shape.

8. The arrangement as claimed in claim 7, wherein at least two split ring resonators of the plurality of split ring resonators are matchable/decoupleable as a function of a configuration of the polygonal shape of the interlocking ring structures.

9. The arrangement as claimed in claim 2, wherein predetermined ring structures, a plurality of metal conductors, or the predetermined ring structures and the plurality of metal conductors are bridgeable.

10. The arrangement as claimed in claim 3, wherein predetermined ring structures, a plurality of metal conductors, or the predetermined ring structures and the plurality of metal conductors are bridgeable.

11. The arrangement as claimed in claim 4, wherein predetermined ring structures, a plurality of metal conductors, or the predetermined ring structures and the plurality of metal conductors are bridgeable.

12. The arrangement as claimed in claim 2, wherein the plurality of split ring resonators have different sizes, conductor widths, or sizes and conductor widths.

13. The arrangement as claimed in claim 3, wherein the plurality of split ring resonators have different sizes, conductor widths, or sizes and conductor widths.

14. The arrangement as claimed in claim 4, wherein the plurality of split ring resonators have different sizes, conductor widths, or sizes and conductor widths.

15. The arrangement as claimed in claim 5, wherein the plurality of split ring resonators have different sizes, conductor widths, or sizes and conductor widths.

16. A magnetic resonance tomography device comprising:
an arrangement comprising:
a plurality of split ring resonators on a planar substrate,
wherein each split ring resonator of the plurality of split ring resonators comprises two mutually parallel ring structures of a metal conductor spaced apart by the planar substrate,
wherein each ring structure of the two mutually parallel ring structures comprises a gap,
wherein at least two split ring resonators of the plurality of split ring resonators are positioned relative to one another such that ring structures of a first split ring resonator and a second split ring resonator of the plurality of split ring resonators_are reciprocally positioned through gaps of ring structures and interlock, and
wherein overlap regions are produced by inner surfaces of the ring structures of the first split ring resonator and the second split ring resonator, the overlap regions configured for DC isolation of the at least two interlocked split ring resonators.

17. The magnetic resonance tomography device as claimed in claim 16, wherein the interlocking ring structures of the metal conductor have no common contact points.

18. The magnetic resonance tomography device as claimed in claim 16, wherein the interlocking ring structures have a polygonal shape.

19. The magnetic resonance tomography device as claimed in claim 18, wherein at least two split ring resonators of the plurality of split ring resonators are matchable/decoupleable as a function of a configuration of the polygonal shape of the interlocking ring structures.

20. The magnetic resonance tomography device as claimed in claim 16, wherein predetermined ring structures, a plurality of metal conductors, or the predetermined ring structures and the plurality of metal conductors are bridgeable.

* * * * *